US012745466B2

(12) United States Patent
Zhu

(10) Patent No.: US 12,745,466 B2
(45) Date of Patent: Sep. 22, 2026

(54) Fin FIELD-EFFECT TRANSISTOR, ESD PROTECTION CIRCUIT, FILTER CIRCUIT, AND ELECTRONIC DEVICE

(71) Applicant: Huawei Technologies Co., Ltd., Shenzhen (CN)

(72) Inventor: Qianming Zhu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 665 days.

(21) Appl. No.: 18/175,096

(22) Filed: Feb. 27, 2023

(65) Prior Publication Data

US 2023/0230974 A1 Jul. 20, 2023

Related U.S. Application Data

(63) Continuation of application No. PCT/CN2020/112663, filed on Aug. 31, 2020.

(51) Int. Cl.

| | |
|---|---|
| ***H10D 89/60*** | (2025.01) |
| ***H10D 1/47*** | (2025.01) |
| ***H10D 30/62*** | (2025.01) |
| ***H10D 84/01*** | (2026.01) |
| ***H10D 84/80*** | (2025.01) |

(52) U.S. Cl.

CPC ............ *H10D 89/814* (2025.01); *H10D 1/47* (2025.01); *H10D 84/0158* (2025.01); *H10D 84/817* (2025.01); *H10D 89/811* (2025.01); *H10D 89/911* (2025.01); *H10D 30/62* (2025.01); *H10D 84/811* (2025.01)

(58) Field of Classification Search

CPC .. H10D 89/811; H10D 89/911; H10D 89/814; H10D 84/0158; H10D 84/817; H10D 30/62; H10D 84/811; H10D 1/47

See application file for complete search history.

(56) References Cited

U.S. PATENT DOCUMENTS

| | | | | |
|---|---|---|---|---|
| 2015/0102394 A1* | 4/2015 | Yoo | H10D 89/811 257/296 |
| 2018/0151554 A1* | 5/2018 | Peng | H10D 89/815 |
| 2021/0050343 A1* | 2/2021 | Kong | H10D 89/819 |

* cited by examiner

*Primary Examiner* — Aaron J Gray

(74) *Attorney, Agent, or Firm* — Conley Rose, P.C.

(57) ABSTRACT

A FinFET includes at least two fins arranged in parallel, a plurality of valid gates, and a first dummy polycrystalline silicon. The at least two fins extend in a first direction, and the plurality of valid gates and the first dummy polycrystalline silicon extend in a second direction and cover surfaces of the at least two fins. The first dummy polycrystalline silicon is located on one side of the plurality of valid gates, and fins on both sides of each of the plurality of valid gates are respectively a source terminal and a drain terminal of the FinFET. The plurality of valid gates is coupled to a gate terminal of the FinFET. The first dummy polycrystalline silicon is coupled between the gate terminal of the FinFET and a resistor potential terminal.

20 Claims, 10 Drawing Sheets

Fin FIELD-EFFECT TRANSISTOR, ESD PROTECTION CIRCUIT, FILTER CIRCUIT, AND ELECTRONIC DEVICE

CROSS-REFERENCE TO RELATED APPLICATIONS

This application is a continuation application of International Patent Application No. PCT/CN2020/112663, filed on Aug. 31, 2020, the disclosure of which is hereby incorporated by reference in its entirety.

TECHNICAL FIELD

This application relates to the field of chip technologies, and in particular, to a fin field-effect transistor (FinFET), an electrostatic discharge (ESD) protection circuit, a filter circuit, and an electronic device.

BACKGROUND

With continuous evolution of semiconductor processes and continuous expansion of chip size, a resistor in a chip occupies an increasingly large area. In particular, resistors in some functional circuits with a high resistance requirement, such as an ESD and a filter, occupy an extremely large proportion of a chip area. For a full chip, many similar functional circuits are generally required, and an area is very considerable. In particular, with a deep nano-process, chip manufacturing costs are becoming increasingly high, and consequently chip design costs are extremely high.

SUMMARY

Embodiments of this application provide a FinFET, an ESD protection circuit, a filter circuit, and an electronic device, to optimize a problem of a large chip area caused by a resistor in a chip.

According to a first aspect, an embodiment of this application provides a FinFET, including one or more fins arranged in parallel, a plurality of valid gates, and first dummy polycrystalline silicon. The one or more fins all extend in a first direction, and the plurality of valid gates and the first dummy polycrystalline silicon all extend in a second direction and cover surfaces of the one or more fins arranged in parallel. The first dummy polycrystalline silicon is located on one side of the plurality of valid gates, and fins on both sides of each of the plurality of valid gates are respectively a source terminal and a drain terminal of the FinFET. The plurality of valid gates is coupled to a gate terminal of the FinFET. The first dummy polycrystalline silicon is coupled between the gate terminal of the FinFET and a resistor potential terminal.

In the foregoing FinFET, dummy polycrystalline silicon on the FET is used as a resistor, so that an area occupied by the resistor can be reduced or the resistor can be avoided from additionally occupying an area of a chip. Therefore, the chip is further miniaturized, a degree of integration of the chip is improved, and manufacturing costs of the chip are reduced.

In a possible implementation, a first end of the first dummy polycrystalline silicon is coupled to the gate terminal of the FinFET, and a second end of the first dummy polycrystalline silicon is coupled to the resistor potential terminal.

In a possible implementation, the FinFET may further include second dummy polycrystalline silicon. The second dummy polycrystalline silicon extends in the second direction and covers the surfaces of the one or more fins arranged in parallel, the dummy polycrystalline silicon is located on the other end of the plurality of valid gates, a first end of the first dummy polycrystalline silicon is coupled to the gate terminal of the FinFET, a second end of the first dummy polycrystalline silicon is coupled to a first end of the second dummy polycrystalline silicon, and a second end of the second dummy polycrystalline silicon is coupled to the resistor potential terminal.

In the foregoing FinFET, a plurality of pieces of dummy polycrystalline silicon on both sides are connected in series and used as a resistor, so that resistance of the resistor can be increased, and a requirement, of a circuit to which the FinFET is applied, for high resistance of the FinFET is met. When the FinFET is applied to an ESD protection circuit, uniform opening of a plurality of fins can be more stably controlled.

Optionally, in a possible implementation, the FinFET may further include a first dummy gate and a second dummy gate. Both the first dummy gate and the second dummy gate extend in the second direction and cover the surfaces of the one or more fins arranged in parallel. The first dummy gate is located between the first dummy polycrystalline silicon and the plurality of valid gates. The second dummy gate is located between the second dummy polycrystalline silicon and the plurality of valid gates. Both the first dummy gate and the second dummy gate are suspended.

In the foregoing FinFET, a suspended dummy gate is introduced between the valid gate and the dummy polycrystalline silicon, to isolate the valid gate and the dummy polycrystalline silicon, so that a leakage current between the valid gate and the dummy polycrystalline silicon in an application process is avoided, and performance of the FinFET is improved.

Optionally, materials of the first dummy polycrystalline silicon, the second dummy polycrystalline silicon, the first dummy gate, the second dummy gate, and the valid gate are the same. For example, the first redundant polycrystalline silicon, the second redundant polycrystalline silicon, the first redundant gate, the second redundant gate, and the valid gate are all metal.

In a possible implementation, the FinFET may further include third dummy polycrystalline silicon. The third dummy polycrystalline silicon extends in the second direction and covers the surfaces of the one or more fins arranged in parallel. The third dummy polycrystalline silicon and the first dummy polycrystalline silicon are located on a same side of the plurality of valid gates. A first end of the first dummy polycrystalline silicon is coupled to the gate terminal of the FinFET, a second end of the first dummy polycrystalline silicon is coupled to a first end of the third dummy polycrystalline silicon, and a second end of the third dummy polycrystalline silicon is coupled to the resistor potential terminal.

In the foregoing FinFET, a plurality of pieces of dummy polycrystalline silicon on one side are connected in series and used as a resistor, so that resistance of the resistor can be increased, and a requirement, of a circuit to which the FinFET is applied, for high resistance of the FinFET is met. When the FinFET is applied to an ESD protection circuit, uniform opening of a plurality of fins can be more stably controlled.

Optionally, materials of the first dummy polycrystalline silicon, the third dummy polycrystalline silicon, and the valid gate are the same.

In a possible implementation, the FinFET is an N-type FinFET, the drain terminal is coupled to a signal cable, and both the resistor potential terminal and the source terminal of the FinFET are coupled to a ground terminal of the FinFET, so that a charge on the signal cable is released to the ground terminal.

In a possible implementation, the FinFET is a P-type FinFET, the drain terminal is coupled to a signal cable, and both the resistor potential terminal and the source terminal of the FinFET are coupled to a power terminal of the FinFET, so that a charge on the signal cable is released to the power terminal.

According to a second aspect, an embodiment of this application further provides a planar FET, including: a plurality of valid gates and first dummy polycrystalline silicon.

The plurality of valid gates and the first dummy polycrystalline silicon are arranged in parallel, and the first dummy polycrystalline silicon is located on one side of the plurality of valid gates.

The plurality of valid gates is coupled to a gate terminal of the FET transistor, and active regions on both sides of each of the plurality of valid gates are respectively coupled to a source terminal and a drain terminal of the FET transistor.

The first dummy polycrystalline silicon is coupled between a gate terminal of the FET transistor and a resistor potential terminal.

In the foregoing FET transistor, dummy polycrystalline silicon is fully used, and the dummy polycrystalline silicon is used as a resistor, so that an area occupied by the resistor can be reduced or the resistor can be avoided from additionally occupying an area of a chip. Therefore, the chip is further miniaturized, a degree of integration of the chip is improved, and manufacturing costs of the chip are reduced.

In a possible implementation, a first end of the first dummy polycrystalline silicon is coupled to the gate terminal of the FET transistor, and a second end of the first dummy polycrystalline silicon is coupled to the resistor potential terminal.

In a possible implementation, the FET transistor may further include second dummy polycrystalline silicon. The plurality of valid gates, the first dummy polycrystalline silicon, and the second dummy polycrystalline silicon are disposed at intervals in parallel, the second dummy polycrystalline silicon is located on the other side of the plurality of valid gates, a first end of the first dummy polycrystalline silicon is coupled to the gate terminal of the FET transistor, a second end of the first dummy polycrystalline silicon is coupled to a first end of the second dummy polycrystalline silicon, and a second end of the second dummy polycrystalline silicon is coupled to the resistor potential terminal.

In the foregoing FET transistor, a plurality of pieces of dummy polycrystalline silicon on both sides are connected in series and used as a resistor, so that resistance of the resistor can be increased, and a requirement, of a circuit to which the FET transistor is applied, for high resistance of the FET transistor is met.

In a possible implementation, the FET transistor may further include a first dummy gate and a second dummy gate. The first dummy gate, the second dummy gate, the plurality of valid gates, the first dummy polycrystalline silicon, and the third dummy polycrystalline silicon are disposed at intervals in parallel. The first dummy gate is located between the first dummy polycrystalline silicon and the plurality of valid gates. The second dummy gate is located between the second dummy polycrystalline silicon and the plurality of valid gates. Both the first dummy gate and the second dummy gate are suspended.

In the foregoing FET transistor, a suspended dummy gate is introduced before the valid gate and the dummy polycrystalline silicon, to isolate the valid gate and the dummy polycrystalline silicon, so that a leakage current before the valid gate and the dummy polycrystalline silicon in an application process is avoided, and performance of the FET transistor is improved.

Optionally, materials of the first dummy polycrystalline silicon, the second dummy polycrystalline silicon, the first dummy gate, the second dummy gate, and the valid gate are the same. For example, the first dummy polycrystalline silicon, the second dummy polycrystalline silicon, the first dummy gate, the second dummy gate, and the valid gate are all metal.

In a possible implementation, the FET transistor may further include third dummy polycrystalline silicon. The plurality of valid gates, the first dummy polycrystalline silicon, and the third dummy polycrystalline silicon are disposed at intervals in parallel, the third dummy polycrystalline silicon and the first dummy polycrystalline silicon are located on a same side of the plurality of valid gates, a first end of the first dummy polycrystalline silicon is coupled to the gate terminal of the FET transistor, a second end of the first dummy polycrystalline silicon is coupled to a first end of the third dummy polycrystalline silicon, and a second end of the third dummy polycrystalline silicon is coupled to the resistor potential terminal.

In the foregoing FET transistor, a plurality of pieces of dummy polycrystalline silicon on one side are connected in series and used as a resistor, so that resistance of the resistor can be increased, and a requirement, of a circuit to which the FET transistor is applied, for high resistance of the FET transistor is met.

Optionally, materials of the first dummy polycrystalline silicon, the third dummy polycrystalline silicon, and the valid gate are the same.

In a possible implementation, the FET transistor is an N-type metal-oxide-semiconductor field-effect transistor (NMOSFET), the drain terminal is coupled to a signal cable, and both the resistor potential terminal and the source terminal of the FET transistor are coupled to a ground terminal of the FET transistor.

In a possible implementation, the FET transistor is a P-type metal-oxide-semiconductor field-effect transistor (PMOSFET), the drain terminal is coupled to a signal cable, and both the resistor potential terminal and the source terminal of the FET transistor are coupled to a power terminal of the FET transistor.

According to a third aspect, an embodiment of this application further provides an ESD protection circuit, including any FinFET in the first aspect or any FET in the second aspect.

The ESD protection circuit is coupled to a first functional circuit and a second functional circuit.

The first functional circuit is coupled to the second functional circuit by using a signal cable, and the FinFET is coupled to the signal cable.

Optionally, the first functional circuit is a digital logic circuit, and the second functional circuit is an analog logic circuit.

Optionally, the first functional circuit and the second functional circuit are respectively located on different chips.

In a possible implementation, a drain terminal of the FinFET is coupled to a signal cable, and a source terminal and a resistor potential terminal are coupled to a ground terminal, to release a charge on the signal cable to the ground terminal.

In a possible implementation, a drain terminal of the FinFET is coupled to a signal cable, and a source terminal and a resistor potential terminal are coupled to a power terminal, to release a charge on the signal cable to the power terminal.

According to a fourth aspect, an embodiment of this application further provides a filter circuit, including any FinFET in the first aspect or any FET in the second aspect.

Optionally, the FinFET or the FET is an NMOSFET, and a drain terminal is connected to an input signal. A common end of a gate terminal and a first end of first dummy polycrystalline silicon are connected to output a signal. A source terminal and a resistor potential terminal are coupled to a ground terminal.

Optionally, the filter circuit further includes a capacitor, one end of the capacitor is coupled to the common end, and the other end of the capacitor is coupled to the ground terminal.

According to a fifth aspect, an embodiment of this application further provides an electronic device, including: a circuit board, and any FinFET in the first aspect, any FET in the second aspect, any ESD protection circuit in the third aspect, or any filter circuit in the fourth aspect.

Optionally, the circuit board may include at least one of a processor, a memory, a communication module, an input module, an output module, a sensor, or the like.

BRIEF DESCRIPTION OF DRAWINGS

The following briefly describes the accompanying drawings required for describing the embodiments.

DESCRIPTION OF EMBODIMENTS

Figure 1:
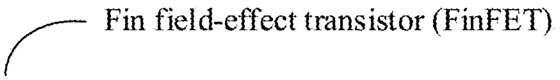
FIG. 1 is a schematic diagram of a structure of a FinFET according to an embodiment of this application.
Figure 1:
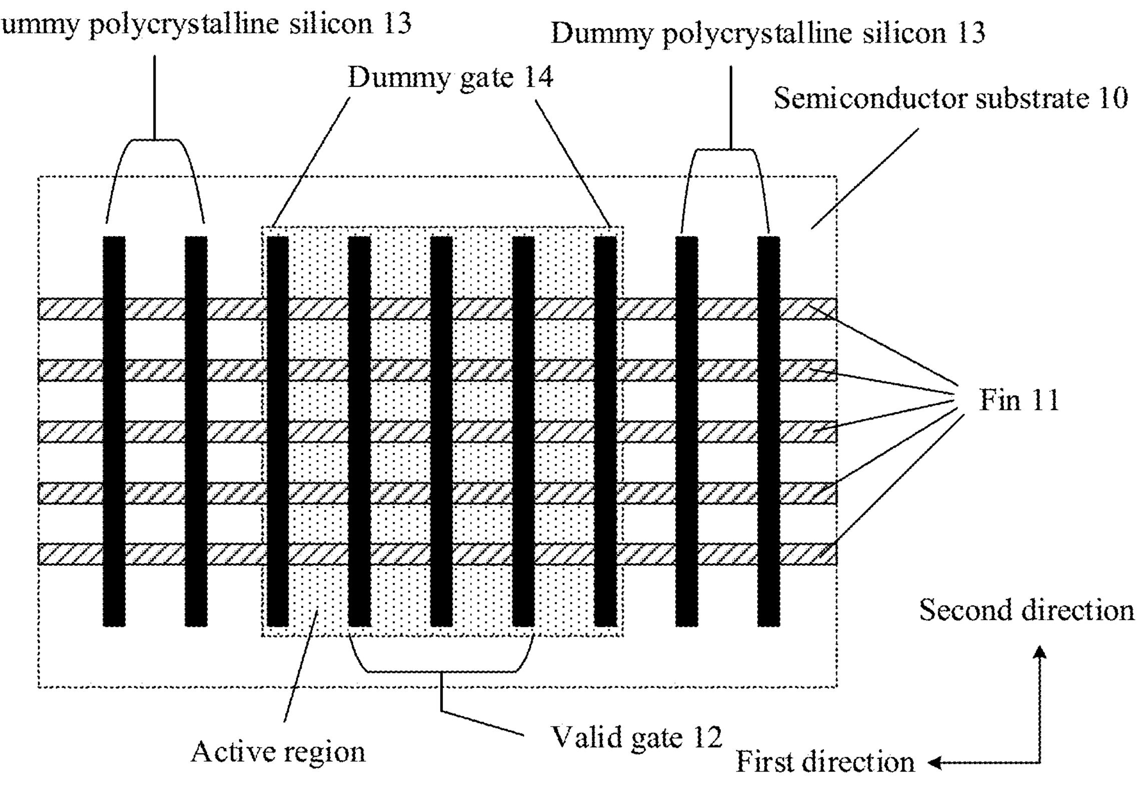

The following clearly describes the technical solutions in embodiments of this application with reference to the accompanying drawings in embodiments of this application.

A sequence number such as "first" or "second" of a component in this application is merely used to distinguish between described objects, and does not have any sequence or technical meaning. However, in this application, "connection" includes a direct connection and an indirect connection unless otherwise specified. In descriptions of this application, it should be understood that an orientation or location relationship indicated by terms "up", "down", "before", "after", "left", "right", "vertical", "horizontal", "top", "bottom", "inside", and "outside" is based on an orientation or location relationship shown in the accompanying drawings, and is merely for ease of description and simplification of this application, and is not intended to indicate or imply that a referred apparatus or component needs to have a specific orientation or be constructed or operated in a specific orientation. Therefore, the orientation or location relationship cannot be understood as a limitation of this application.

In this application, "coupling" may mean a direct connection, or an indirect connection, that is, a connection established by using another element or metal.

Abbreviations and technical terms involved in this application are described first.

(1) A metal-oxide-semiconductor field-effect transistor (MOSFET) is also referred to as a MOS transistor, and is a FET. The MOSFET may include a planar MOSFET and a three-dimensional MOSFET, and the three-dimensional MOSFET includes a FinFET. An early MOSFET is mainly a planar structure. A channel of the FinFET includes raised high and thin fins on an insulating substrate, a source and a drain are respectively on two ends of the fin, and a gate is close to a sidewall and a top part of the fin and is used to control an auxiliary current. Such a fin structure increases a surface of the gate around the channel, and strengthens control of the gate over the channel, so that a short channel effect in the planar MOSFET can be effectively alleviated, circuit control can be significantly improved, and a leakage current can be reduced.

(2) MOSFETs may be classified into an NMOSFET and a PMOSFET. A MOSFET including a P-type substrate and two high-concentration N diffusion regions is referred to as a N-channel MOSFET, that is, the NMOSFET. A MOSFET including an N-type substrate and two high-concentration P diffusion regions is referred to as a P-channel MOSFET, that is, the PMOSFET.

(3) An ESD protection circuit is a discharge path that provides an electro static circuit for an integrated circuit or an electronic component, to avoid damage to the integrated circuit or the electronic component caused when electro static electricity breaks down the integrated circuit or the electronic component. Generally, the ESD protection circuit is added to an input terminal of a chip or a functional circuit.

(4) A gate-grounded NMOSFET (GGNMOS) is an ESD protection circuit. Generally, a drain of the GGNMOS is connected to a signal cable (e.g., a PAD), and a gate terminal is connected to a ground terminal, so that a charge on the signal cable can be released to the ground terminal.

(5) A gate-grounded PMOSFET (GGPMOS) is an ESD protection circuit. Generally, a drain of the GGPMOS is connected to a signal cable (PAD), and a gate terminal is connected to a power terminal, so that a charge on the signal cable can be released to the power terminal.

(6) A charged device model (CDM) is a mode/model of ESD.

(7) Dummy polycrystalline silicon (dummy poly) and a dummy gate are dummy parts required by some FET transistors in a process processing process, and are located on both sides of the FET transistor, so that performance of an intermediate functional component can be improved. The dummy polycrystalline silicon is on an outer side of an active region of the FET transistor, and the dummy gate is suspended on the active region, and is used to isolate the active region and the dummy polycrystalline silicon. In this embodiment of this application, the dummy polycrystalline silicon in the FET transistor is used as a resistor.

FIG. 1 is a schematic diagram of a structure of a FinFET according to an embodiment of this application. The FinFET may include but is not limited to one or more fins 11 arranged in parallel, a plurality of valid gates 12, one or more pieces of dummy polycrystalline silicon 13, one or more dummy gates 14, and the like. The one or more fins 11 are disposed on a semiconductor substrate 10 and all extend in a first direction. The plurality of valid gates 12, the one or more pieces of dummy polycrystalline silicon 13, and the one or more dummy gates 14 all extend in a second direction and cover surfaces of the one or more fins 11 arranged in parallel. The one or more pieces of dummy polycrystalline silicon 13 may be located on one side or both sides of the plurality of valid gates 12. The dummy gate 14 is located between the valid gate 12 and the dummy polycrystalline silicon 13, and is used to isolate the valid gate 12 and the dummy polycrystalline silicon 13, and both the valid gate 12 and the dummy polycrystalline silicon 13 are suspended (that is, are not connected to an external circuit). It should be understood that the dummy gate 14 is not an indispensable structure of the FinFET. For example, when a length of the FinFET is greater than a preset value, the FinFET may not include the dummy gate 14. Herein, the length of the FinFET is a length of the FinFET in the second direction.

It should be further understood that the first direction is perpendicular to or nearly perpendicular to the second direction. “Nearly perpendicular” may be understood as that a value range of an included angle between the first direction and the second direction is from 60° to 120°, and each embodiment of this application is described by using an example in which the first direction is perpendicular to the second direction.

In some embodiments, materials of the valid gate 12, the dummy polycrystalline silicon 13, and the dummy gate 14 may be the same, and the materials of the valid gate 12, the dummy polycrystalline silicon 13, and the dummy gate 14 may be all metal. Optionally, the valid gate 12, the dummy polycrystalline silicon 13, and the dummy gate 14 may also be prepared by using a same process. Optionally, the plurality of valid gates 12, the one or more pieces of dummy polycrystalline silicon 13, and the one or more dummy gates 14 may be arranged at equal intervals. The plurality of valid gates 12, the one or more pieces of dummy polycrystalline silicon 13, and the one or more dummy gates 14 have a same length and a same width. The length is a side length in the second direction, and the width is a side length in the first direction.

The plurality of valid gates 12 jointly constitute a gate terminal of the FinFET. Alternatively, the plurality of valid gates is all coupled to the gate terminal of the FinFET, and in this case, the gate terminal is a common terminal coupled to the plurality of valid gates.

Fins on both sides of each of the plurality of valid gates 12 are active regions of the FinFET, and are respectively a source and a drain. Fins covered by the valid gate are channels of the FinFET. Fins on both sides of each valid gate form the source terminal and the drain terminal of the FinFET. Alternatively, the fins on both sides of each valid gate are respectively coupled to the source terminal and the drain terminal of the FinFET, and in this case, the source terminal is a common terminal coupled to each source terminal, and the drain terminal is a common terminal coupled to each drain terminal.

Fins on both sides of the dummy gate are also an active region of the FinFET, but are suspended.

It should be noted that a region in which the plurality of valid gates, the one or more dummy gates, and the active region are located is referred to as an active region.

Fins on both sides of the dummy polycrystalline silicon and covered fins are all non-active regions; in other words, no N-type or P-type ion is implanted, and a structure with a source, a channel, and a drain is not formed. A region in which the fins are located is referred to as a non-active region, that is, a region except the active region on the semiconductor substrate 10. It should be noted that the dummy polycrystalline silicon is a conductor material, and the dummy polycrystalline silicon is an inherent dummy structure in the FinFET. In this embodiment of this application, one or more pieces of dummy polycrystalline silicon form a resistor that connects the gate terminal and the resistor potential terminal, so that an area and preparation costs of a chip are reduced.

In this embodiment of this application, a resistor formed by using one piece of dummy polycrystalline silicon 13 or a resistor formed after a plurality of pieces of dummy polycrystalline silicon 13 on one side or both sides of the valid gate 12 are connected in series is used to increase resistance of a resistor in FinFET, to uniformly open a plurality of fins.

Figure 2:
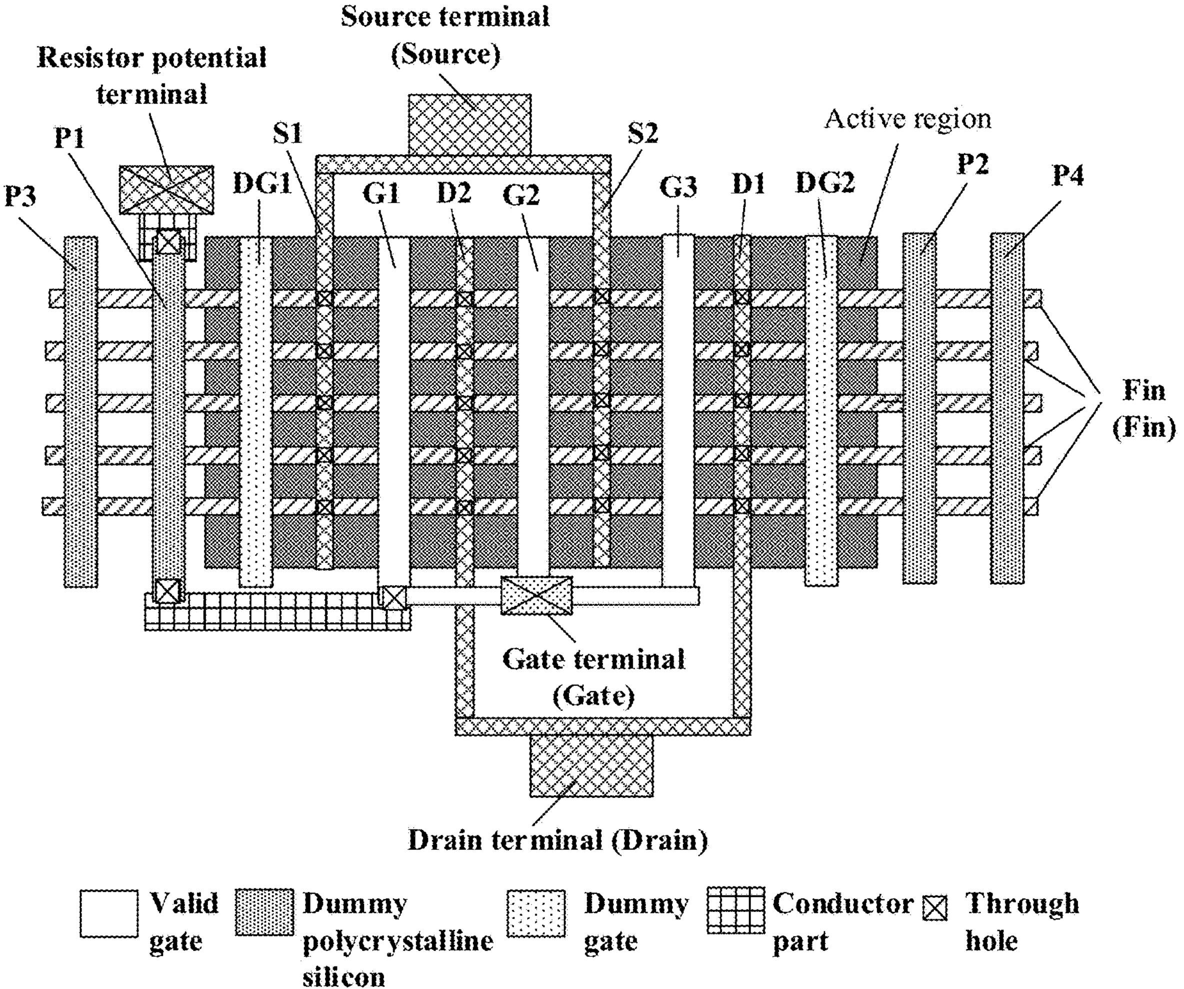
FIG. 2 is a schematic diagram of a structure of another FinFET according to an embodiment of this application.

In some embodiments, the resistor that connects the gate terminal and the resistor potential terminal may be formed by using one piece of dummy polycrystalline silicon. For example, FIG. 2 is a schematic diagram of a structure of a FinFET. The FinFET includes first dummy polycrystalline silicon P1, second dummy polycrystalline silicon P2, third dummy polycrystalline silicon P3, and fourth dummy polycrystalline silicon P4. The first dummy polycrystalline silicon P1 and the third dummy polycrystalline silicon P3 are located on one side of a first valid gate G1, a second valid gate G2, and a third valid gate G3, and the second dummy polycrystalline silicon P2 and the fourth dummy polycrystalline silicon P4 are located on the other side of the first valid gate G1, the second valid gate G2, and the third valid gate G3. A first end of the first dummy polycrystalline silicon P1 is coupled to a gate terminal of the FinFET, sources S1 and S2 of the FinFET are jointly connected to a source terminal, and drains D1 and D2 of the FinFET are connected to a drain terminal.

As shown in FIG. 2, a second end of the first dummy polycrystalline silicon P1 is coupled to a resistor potential terminal. It should be understood that the first end and the second end of the first dummy polycrystalline silicon P1 are two ends of the first dummy polycrystalline silicon P1 in a second direction.

In some embodiments, the resistor that connects the gate terminal and the resistor potential terminal may be formed by connecting a plurality of pieces of dummy polycrystalline silicon on both sides of the valid gate in series. For example, in a schematic diagram of a structure of the FinFET shown in FIG. 3, the dummy polycrystalline silicon included in the FinFET further includes the second dummy polycrystalline silicon P2. The second dummy polycrystalline silicon P2 also extends in the second direction and covers surfaces of one or more fins arranged in parallel. The second dummy polycrystalline silicon P2 is located on the other side of the plurality of valid gates (G1, G2, and G3), that is, a side of the plurality of valid gates that is far away from the first dummy polycrystalline silicon P1. The second end of the first dummy polycrystalline silicon P1 is coupled to a first end of the second dummy polycrystalline silicon P2, and a second end of the second dummy polycrystalline silicon P2 is coupled to the resistor potential terminal. It should be understood that the first end and the second end of the second dummy polycrystalline silicon P2 are two ends of the second dummy polycrystalline silicon P2 in the second direction. In this embodiment, two pieces of dummy polycrystalline silicon on both sides of the valid gate are connected in series and used as a resistor, so that resistance of the resistor can be increased, to fully use the dummy polycrystalline silicon and more uniformly enable the FinFET.

In some embodiments, the resistor that connects the gate terminal and the resistor potential terminal may be formed by connecting a plurality of pieces of dummy polycrystalline silicon on one side of the valid gate in series. For example, in a schematic diagram of a structure of the FinFET shown in FIG. 4, the third dummy polycrystalline silicon P3 also extends in the second direction and covers the surfaces of the one or more fins arranged in parallel, and the third dummy polycrystalline silicon P3 and the first dummy polycrystalline silicon P1 are located on a same side of the valid gates (G1, G2, and G3). The second end of the first dummy polycrystalline silicon P1 is coupled to a first end of the third dummy polycrystalline silicon P3, and the second end of the third dummy polycrystalline silicon P3 is coupled to the resistor potential terminal. It should be understood that the first end and the second end of the third dummy polycrystalline silicon P3 are two ends of the third dummy polycrystalline silicon P3 in the second direction. In this embodiment, two pieces of dummy polycrystalline silicon on one side of the valid gate are connected in series and used as a resistor, so that resistance of the resistor can be increased, to fully use the dummy polycrystalline silicon and more uniformly enable the FinFET.

Figure 3:
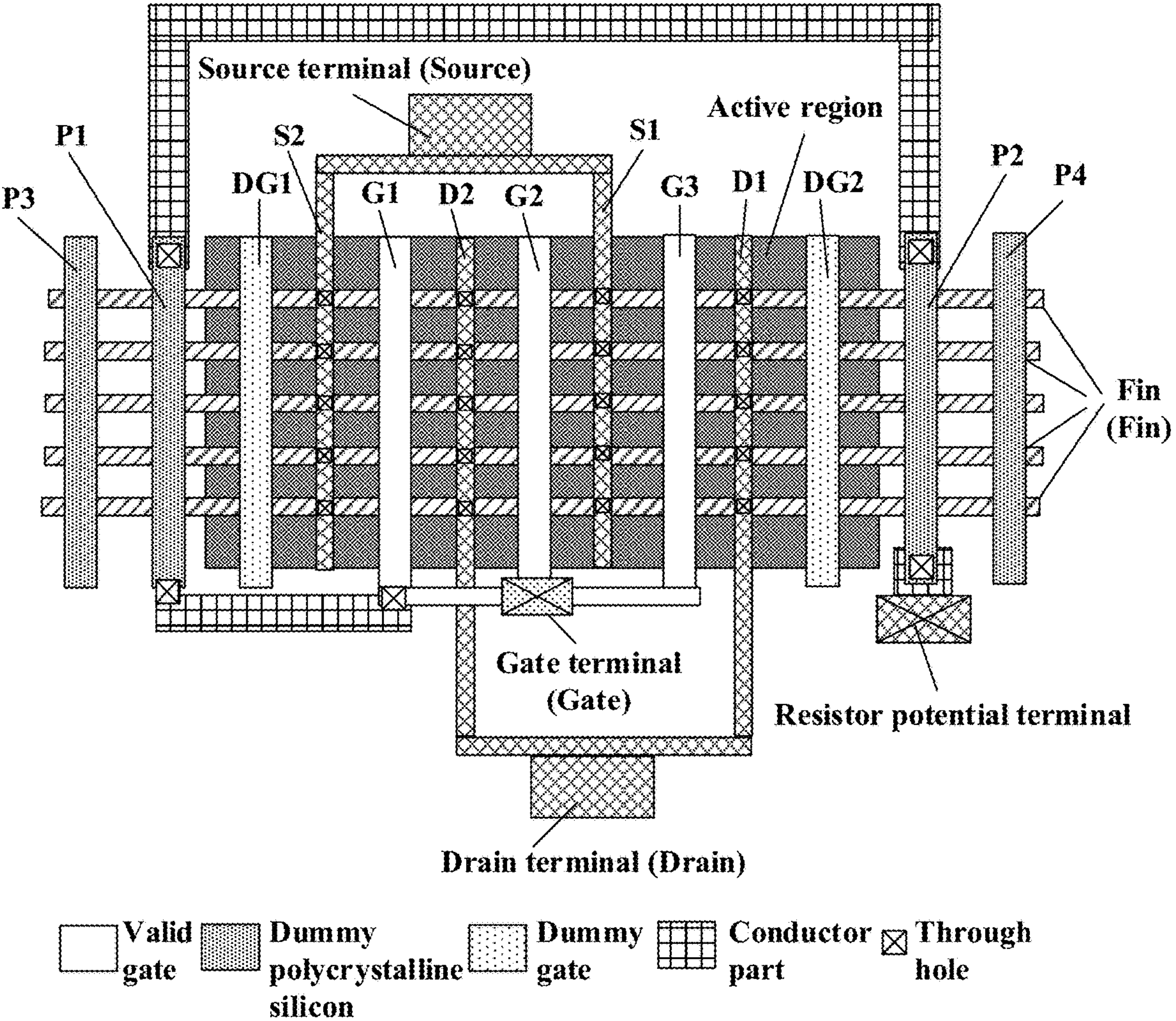
FIG. 3 is a schematic diagram of a structure of still another FinFET according to an embodiment of this application.
Figure 4:
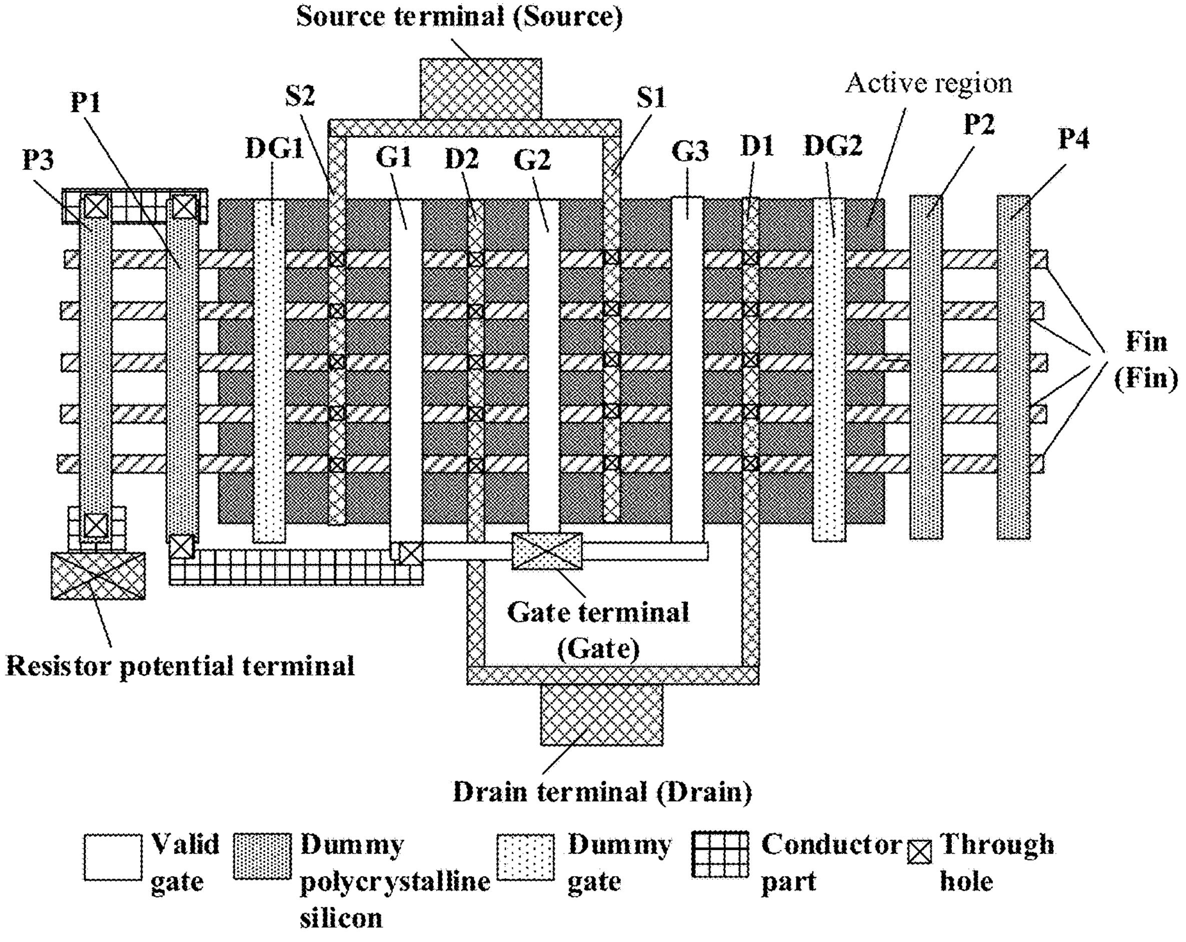
FIG. 4 is a schematic diagram of a structure of still another FinFET according to an embodiment of this application.

Optionally, any FinFET shown in FIG. 2 to FIG. 4 may include a first dummy gate DG1 and a second dummy gate DG2. The first dummy gate DG1 is located between the first dummy polycrystalline silicon P1 and the plurality of valid gates (G1, G2, and G3). The second dummy gate DG2 is located between the second dummy polycrystalline silicon P2 and the plurality of valid gates (G1, G2, and G3). Both the first dummy gate DG1 and the second dummy gate DG2 are suspended.

It should be noted that, FIG. 3 and FIG. 4 are described using an example in which two pieces of dummy polycrystalline silicon on both sides or one side of the valid gate. In some other embodiments of this embodiment of this application, the resistor that connects the gate terminal and the resistor potential terminal may be formed by connecting more valid gates on both sides or one side of the valid gate in series.

In some embodiments, the FinFET is an N-type FinFET whose drain terminal is coupled to a signal cable, and both the resistor potential terminal and the source terminal of the FinFET are coupled to a ground terminal of the FinFET.

In some embodiments, the FinFET is a P-type FinFET whose drain terminal is coupled to a signal cable, and both the resistor potential terminal and the source terminal of the FinFET are coupled to a power terminal of the FinFET.

It should be noted that the valid gate, the dummy gate, and the dummy polycrystalline silicon are covered on the fins, and are not directly in contact with the fins. A gate insulation layer (not shown in the figure) is further included between the valid gate, the dummy gate, and the dummy polycrystalline silicon and the fins, and the gate insulation layer is an insulating material such as silicon dioxide or silicon nitride, and is used to isolate the valid gate, the dummy gate, and the dummy polycrystalline silicon from the fins. It should be further noted that the FinFET may further include another indispensable structure or a dispensable structure. This is not limited herein.

Figure 5:
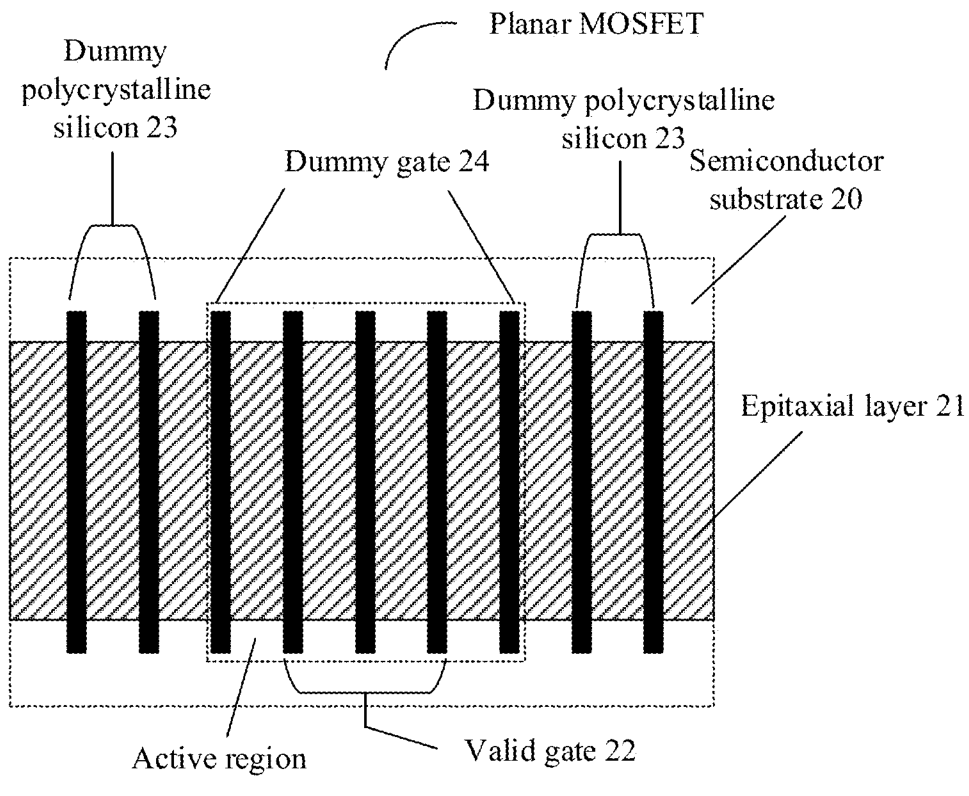
FIG. 5 is a schematic diagram of a structure of a planar FET according to an embodiment of this application.

FIG. 5 is a schematic diagram of a structure of a planar FET according to an embodiment of this application. The FET may include an epitaxial layer 50, a plurality of valid gates 51, one or more pieces of dummy polycrystalline silicon 52, one or more dummy gates 53, and the like. The plurality of valid gates 51, the one or more pieces of dummy polycrystalline silicon 52, and the one or more dummy gates 53 are disposed on a surface of the epitaxial layer 50, and the plurality of valid gates 51, the one or more pieces of dummy polycrystalline silicon 52, and the one or more dummy gates 53 are disposed at intervals in parallel. The one or more pieces of dummy polycrystalline silicon 52 may be located on one side or both sides of the plurality of valid gates 51. The dummy gate 53 is located between the valid gate 51 and the dummy polycrystalline silicon 52, and is used to isolate the valid gate 51 and the dummy polycrystalline silicon 52. The valid gate 51 and the dummy polycrystalline silicon 52 are suspended (that is, are not connected to an external circuit). It should be understood that the dummy gate 53 is not an indispensable structure of the FET. In some embodiments, the FET may not include the dummy gate 53.

The plurality of valid gates 51 jointly constitute a gate terminal of the FET. Alternatively, the plurality of valid gates 51 are all coupled to the gate terminal of the FET, and in this case, the gate terminal is a common terminal coupled to the plurality of valid gates 51.

The epitaxial layer 50 includes a non-active region, a source, a channel, and a drain. Epitaxial layers 50 on both sides of each valid gate 51 are respectively a source and a drain of the FET. All sources jointly constitute a source terminal of the FET. Alternatively, all the sources are coupled to the source terminal of the FET, and in this case, the source terminal is a common terminal connected to all the sources. The channel is a region opposite to the valid gate in the epitaxial layer, and is located between the source and the drain. Each source and each drain form an active region of the FET. A region in which the plurality of valid gates 51, the one or more dummy gates 53, and the active region are located is referred to as an active region. It should be understood that for an NMOSFET, the epitaxial layer 50 includes a P-well, and a region of the P-well includes an N-type doped source and drain, and for a PMOSFET, the epitaxial layer 50 includes an N-well, and a region of the N-well includes a P-type doped source and drain.

The non-active region is a region except the active region in the FET, and the dummy polycrystalline silicon 52 and epitaxial layers 50 on both sides of the dummy polycrystalline silicon 52 are non-active regions. In some embodiments, the epitaxial layer 50 may include one or more slots formed in a shallow trench isolation (STI) process. The slots may be filled with a dielectric material such as silicon dioxide or silicon nitride. Some of the plurality of slots may be used to isolate sources of two neighboring valid gates or drains of two neighboring valid gates. It should be noted that the dummy polycrystalline silicon 52 is a conductor material, and the dummy polycrystalline silicon 52 is an inherent dummy structure in the FET. In this embodiment of this application, one or more pieces of dummy polycrystalline silicon 52 form a resistor that connects the gate terminal and a resistor potential terminal, so that an area of a chip is reduced.

Figure 6:
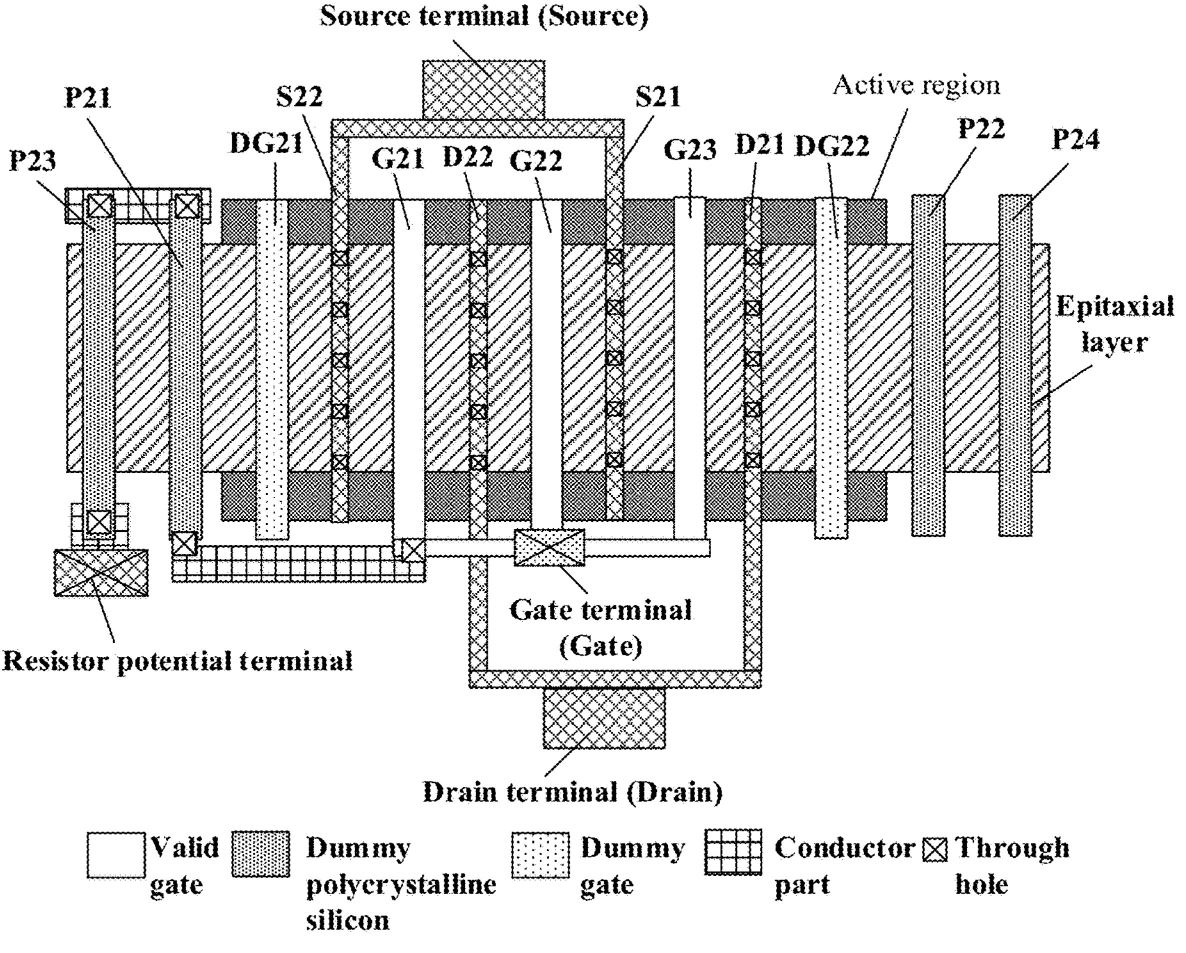
FIG. 6 is a schematic diagram of a structure of another planar FET according to an embodiment of this application.

In some embodiments, the resistor that connects the gate terminal and the resistor potential terminal may be formed by connecting one or more pieces of dummy polycrystalline silicon on both sides of the valid gate in series. For example, FIG. 6 is a schematic diagram of a structure of a FET. The FET includes first dummy polycrystalline silicon P21, second dummy polycrystalline silicon P22, third dummy polycrystalline silicon P23, and fourth dummy polycrystalline silicon P24. The first dummy polycrystalline silicon P21 and the third dummy polycrystalline silicon P23 are located on one side of a first valid gate G21, a second valid gate G22, and a third valid gate G23, the second dummy polycrystalline silicon P22 and the fourth dummy polycrystalline silicon P24 are located on the other side of the first valid gate G21, the second valid gate G22, and the third valid gate G23, sources S21 and S22 of the FET are jointly connected to a source terminal, and drains D21 and D22 of the FET are jointly connected to a drain terminal.

In some embodiments, a resistor that connects a gate terminal and a resistor potential terminal may be formed by using one piece of dummy polycrystalline silicon. For example, the first dummy polycrystalline silicon P21 is used. The first dummy polycrystalline silicon P21 is located on one side of the plurality of valid gates, a first end of the first dummy polycrystalline silicon P21 is coupled to the gate terminal of the FET, and a second end of the first dummy polycrystalline silicon P21 is coupled to the resistor potential terminal. It should be understood that the first end and the second end of the first dummy polycrystalline silicon P21 are two ends of the first dummy polycrystalline silicon P21 in an extension direction of the first dummy polycrystalline silicon P21.

In some embodiments, the resistor that connects the gate terminal and the resistor potential terminal may be formed by using a plurality of pieces of dummy polycrystalline silicon. For example, dummy polycrystalline silicon included in the FET shown in FIG. 6 includes the first dummy polycrystalline silicon P21 and the third dummy polycrystalline silicon P23. The first dummy polycrystalline silicon P21 and the third dummy polycrystalline silicon P23 are located on a same side of the plurality of valid gates (G21, G22, and G23). A second end of the first dummy polycrystalline silicon P21 is coupled to a first end of the third dummy polycrystalline silicon P23, and a second end of the third dummy polycrystalline silicon P23 is coupled to the resistor potential terminal. It should be understood that the first end and the second end of the third dummy polycrystalline silicon P23 are two ends of the third dummy polycrystalline silicon P23 in an extension direction of the third dummy polycrystalline silicon P23. In this embodiment, two pieces of dummy polycrystalline silicon on both sides of the valid gate are connected in series and used as a resistor, so that resistance of the resistor can be increased, to fully use the dummy polycrystalline silicon and more uniformly enable the FET.

In some other embodiments of this application, the first dummy polycrystalline silicon P21 and the second dummy polycrystalline silicon P22 may also be connected in series and used as the resistor that connects the gate terminal and the resistor potential terminal, or another piece of dummy polycrystalline silicon or a plurality of pieces of dummy polycrystalline silicon may be connected in series and used as a resistor. Both the two resistors may be connected by using a conductor part.

In some embodiments, the FET is an NMOSFET whose drain terminal is coupled to a signal cable, and both the resistor potential terminal and the source terminal of the FET are coupled to a ground terminal of the FET.

In some embodiments, the FinFET is a PMOSFET whose drain terminal is coupled to a signal cable, and both the resistor potential terminal and the source terminal of the FinFET are coupled to a power terminal of the FET.

It should be noted that the valid gate, the dummy gate, and the dummy polycrystalline silicon are covered on an epitaxial layer, and are not directly in contact with a channel on the epitaxial layer. A gate insulation layer (not shown in the figure) is further included between the valid gate, the dummy gate, and the dummy polycrystalline silicon and the channel, and the gate insulation layer is an insulating material such as silicon dioxide or silicon nitride, and is used to isolate the valid gate, the dummy gate, and the dummy polycrystalline silicon from the channels. It should be further noted that the FET may further include another indispensable structure or a dispensable structure. This is not limited herein.

FIG. 1 to FIG. 4 are described by using an example in which the FinFET or the FET shown in FIG. 5 and FIG. 6 includes four pieces of dummy polycrystalline silicon, three valid gates, and two dummy gates. In some other embodiments of this application, the FinFET or the FET may further include more or fewer pieces of dummy polycrystalline silicon, valid gates, or dummy gates. The FinFET or the FET may further include more or fewer pieces of dummy polycrystalline silicon or more or fewer pieces of dummy polycrystalline silicon that are connected in series as a resistor, and one end of the resistor is connected to a gate terminal of a FET on which the resistor is located. This is not limited herein.

Optionally, the valid gate, the dummy gate, and the dummy polycrystalline silicon shown in FIG. 1 to FIG. 6 may be prepared by using a same process, have a same material and a same size, and are arranged at equal intervals.

It should be noted that coupling between the foregoing elements may be a direct connection or an indirect connection, for example, the elements are connected by using a conductor part and a through hole shown in FIG. 2 to FIG. 4 and FIG. 6. The conductor part is a conductor, and may be a metal material. The through hole is used to connect different layers of structures.

To resolve an ESD problem in an integrated circuit and an electronic device, especially a charged device model ESD (CDMESD) problem, a manner with an upper diode and a lower diode is generally not used, but a manner of a GGNMOS or a GGPMOS is used. This is because, when power-on sequences of two functional circuits coupled by using a signal cable are different, the manner with an upper diode and a lower diode may lead to leakage of power.

Figure 7:
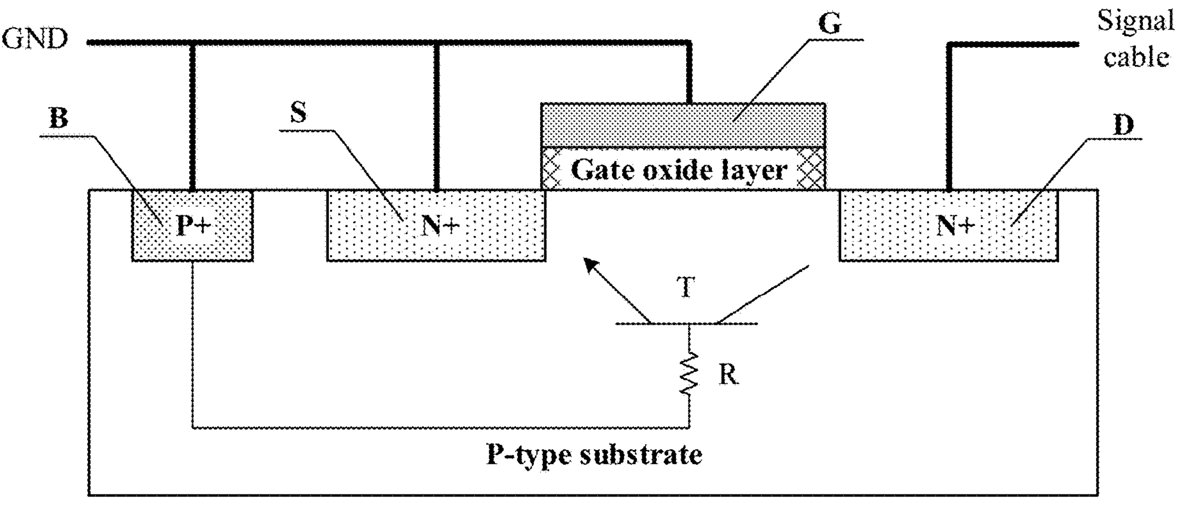
FIG. 7 is a schematic cross-sectional diagram of a grounded-gate NMOSFET (GGNMOSFET) according to an embodiment of this application.

A principle of electro static discharge in an embodiment of this application is described below with reference to a schematic cross-sectional diagram of a GGNMOS shown in FIG. 7. As shown in FIG. 7, the GGNMOS includes a P-type substrate, an N-type heavily doped source (S) and drain (D), and a P-type doped substrate terminal (B). When electro static discharge is performed by using the GGNMOS, the terminal D is coupled to a signal cable.

When a large quantity of negative charges is accumulated at the terminal D connected to the signal cable, a PN junction between the terminal D and the P-type substrate is conducted, and the negative charges are discharged to ground (GND) using the terminal B.

When a large quantity of positive charges is accumulated at the terminal D connected to the signal cable, the PN junction between the terminal D and the P-type substrate is broken down, and a leakage current is generated. Under an action of the leakage current, due to existence of a parasitic resistor R on the substrate, a parasitic diode between the P-type substrate and the terminal S is conducted. In this case, the parasitic transistor T is connected, and a large quantity of charges flow from the terminal D to the terminal S by using the parasitic transistor, and is further discharged to the GND.

The following describes an application scenario of the FinFET shown in FIG. 1 to FIG. 4 and the FET transistor in FIG. 5 or FIG. 6 according to an embodiment of this application. The FinFET and the FET transistor may be applied to an ESD protection circuit, a filter circuit, and the like.

Figure 8A:
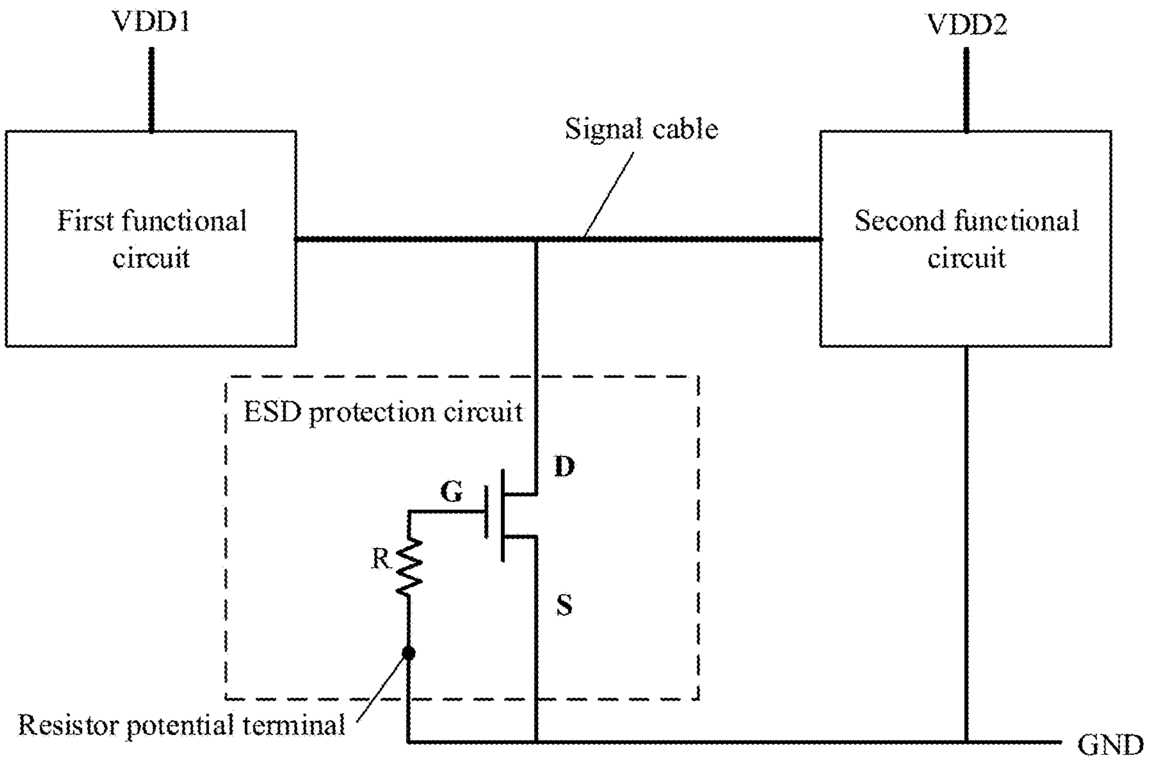
FIG. 8A is a schematic circuit diagram of an ESD protection circuit according to an embodiment of this application.
Figure 8B:
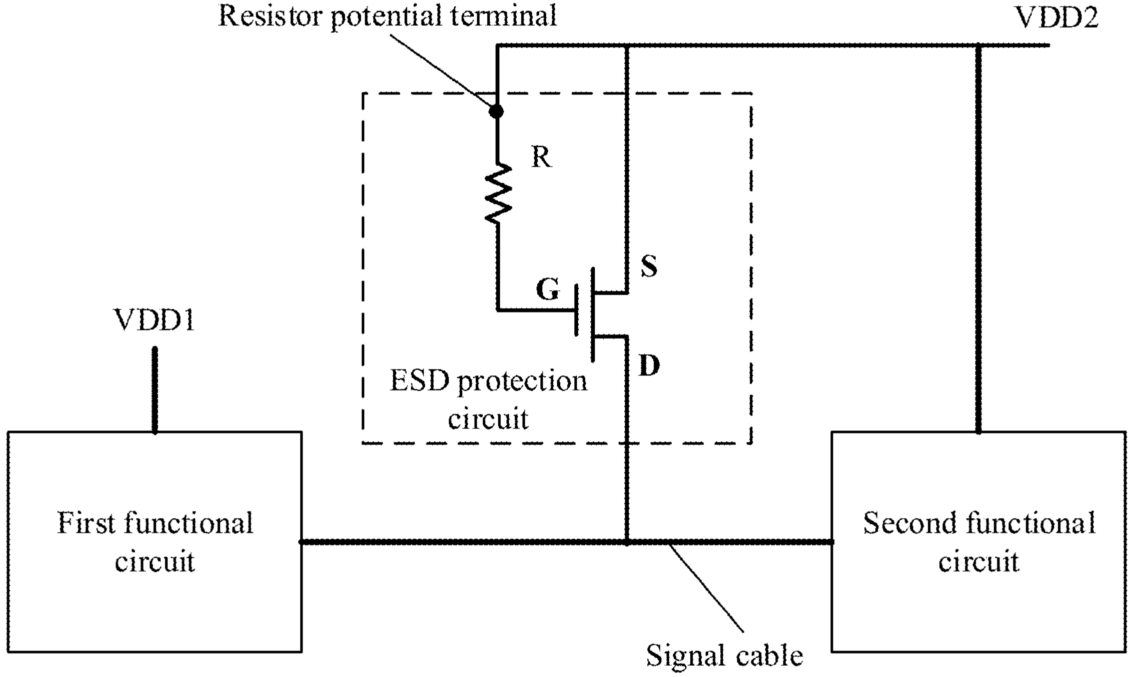
FIG. 8B is a schematic circuit diagram of another ESD protection circuit according to an embodiment of this application.

FIG. 8A and FIG. 8B are schematic circuit diagrams of two ESD protection circuits with reference to the application scenario according to this embodiment of this application. The ESD protection circuit is coupled to a first functional circuit and a second functional circuit. The first functional circuit is coupled to the second functional circuit by using a signal cable, the ESD protection circuit includes a FET transistor, and the FET transistor may be either of the FinFET shown in FIG. 1 to FIG. 4 and the FET transistor shown in FIG. 5 or FIG. 6. A gate terminal G of the FET transistor is connected to one end of a resistor R, and the other end of the resistor R is a resistor potential terminal. A drain terminal D of the FET transistor is connected to the signal cable, so that a charge on the signal cable can be released. The resistor R is the resistor formed by using the dummy polycrystalline silicon in the FinFET shown in FIG. 1 to FIG. 4 or the FET transistor shown in FIG. 5 and FIG. 6.

In a specific implementation, the FET transistor in the ESD protection circuit is an N-type FET, such as an N-type FinFET or an NMOSFET. As shown in FIG. 8A, both a resistor potential terminal and a source terminal S of the N-type FET transistor are coupled to a ground terminal GND to release a charge on a signal cable to a ground terminal GND.

In another specific implementation, the FET transistor in the ESD protection circuit is a P-type FET transistor, such as a P-type FinFET or a PMOSFET. As shown in FIG. 8B, both a resistor potential terminal and a source terminal S of the P-type FET transistor are coupled to a power terminal VDD2 of the second functional circuit, to release a charge on a signal cable to a power terminal VDD2.

The first functional circuit is a circuit used to implement a first function, the second functional circuit is a circuit used to implement a second function, and the first function is generally not equal to the second function. In some embodiments, the first functional circuit may be a digital control circuit that can control the second functional circuit. For example, an analog-to-digital converter (ADC) converts an analog signal into a digital signal.

In some embodiments, a source voltage VDD1 of the first functional circuit in FIG. 8A or FIG. 8B is not equal to a source voltage VDD2 of the second functional circuit.

In some embodiments, the first functional circuit in FIG. 8A or FIG. 8B may be a digital logic circuit, and the second functional circuit may be an analog logic circuit.

In some embodiments, the first functional circuit and the second functional circuit in FIG. 8A or FIG. 8B may be located in different chips.

Figure 8C:
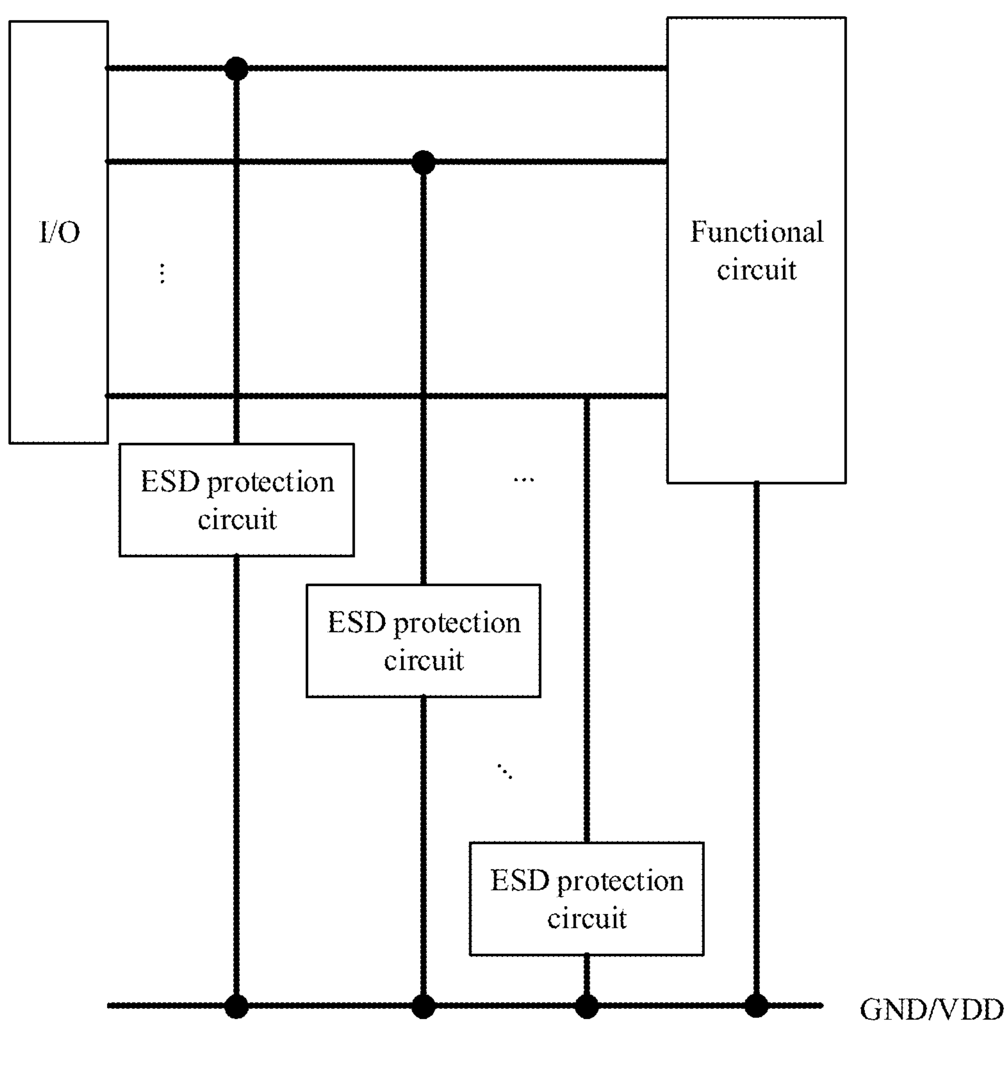
FIG. 8C is a schematic circuit diagram of still another ESD protection circuit according to an embodiment of this application.

FIG. 8C is a schematic circuit diagram of another ESD protection circuit with reference to the application scenario according to this embodiment of this application. When an input/output (I/O) interface is connected to a functional circuit, the I/O interface includes a plurality of pins, and each pin is connected to one signal cable. Some or all of the plurality of signal cables are coupled to an ESD protection circuit. A connection relationship between the ESD protection circuit and a corresponding signal cable is the same as that of the ESD protection circuit shown in FIG. 8A or FIG. 8B. Details are not described herein again.

An embodiment of this application further provides an ESD protection component. The component may include a FET transistor, and the FET transistor may be either of the FinFET shown in FIG. 1 to FIG. 4 and the N-type FET transistor in the FET transistor shown in FIG. 5 or FIG. 6.

An embodiment of this application further provides a filter circuit. The filter circuit may include a FET transistor, and the FET transistor may be either of the FinFET shown in FIG. 1 to FIG. 4 and the N-type FET transistor in the FET transistor shown in FIG. 5 or FIG. 6.

Figure 9:
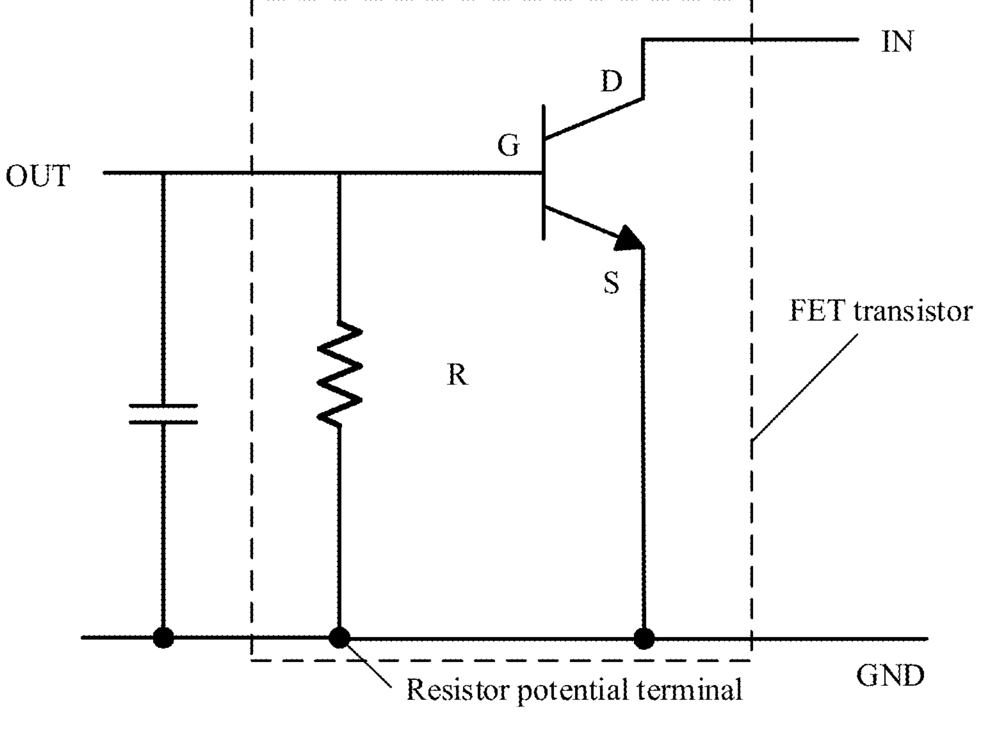
FIG. 9 is a schematic circuit diagram of a filter circuit according to an embodiment of this application.

FIG. 9 is a schematic circuit diagram of an resistor-capacitor (RC) filter circuit. In addition to the foregoing FET transistor, the RC filter circuit may further include a capacitor C. The capacitor C is not an indispensable element of the filter circuit. In some other embodiments of this application, the capacitor C may be included in the FET transistor, and is a parasitic capacitor that is wired in the FET transistor.

A drain terminal D of the FET transistor is connected to an input signal IN, a gate terminal G of the FET transistor is connected to one end of a resistor R, and the other end of the resistor R is a resistor potential terminal. The resistor R is the resistor formed by using the dummy polycrystalline silicon in the FinFET shown in FIG. 1 to FIG. 4 or the FET transistor in FIG. 5 and FIG. 6. One end of the capacitor C is connected to a common terminal of the resistor R and the gate terminal G, and the other end is connected to a ground terminal GND. The FET transistor may be an N-type FET transistor, such as an N-type FinFET or an NMOSFET. Both a resistor potential terminal and a source terminal S of the FET transistor are coupled to the ground terminal GND. The RC filter circuit may implement filtering processing on the input signal IN, to obtain a filtered output signal OUT.

An embodiment of this application further provides an electronic device. The electronic device may be a mobile phone, a notebook computer, a tablet computer, a smart watch, a smart band, a virtual reality (VR)/augmented reality (AR) device, or the like. The electronic device may include a circuit board and the FinFET shown in FIG. 1 to FIG. 4 or the FET shown in FIG. 5 and FIG. 6. Alternatively, the electronic device may include a circuit board and a circuit shown in any one of FIG. 8A to FIG. 8C or FIG. 9. It may be understood that the FinFET or the FET may be located on the circuit board, or may be independent of the circuit board and coupled to the circuit board.

It should be understood that the circuit board may be a mainboard of the electronic device, and the circuit board may include but is not limited to a processor, a memory, a radio frequency module, a power management module, an input module, an output module, a communication interface, one or more sensors, and the like.

The processor may include one or more processing units. For example, the processor may include an application processor (AP), a modem processor, a graphics processing unit (GPU), an image signal processor (ISP), a controller, a memory, a video codec, a digital signal processor (DSP), a baseband processor, and/or a neural-network processing unit (NPU). Different processing units may be independent devices, or may be integrated into one or more processors.

The power management module is configured to connect a battery to a processor, and is configured to supply power to the processor, the memory, the radio frequency module, the power management module, the input module, the output module, the communication interface, the one or more sensors, and the like.

The radio frequency module is configured to send and receive a signal, to implement wireless communication with another device. The input module may include a touch panel, a microphone, and the like. The output module may include a display screen, a loudspeaker, and the like, to implement human-computer interaction between the electronic device and a user. The communication interface is configured to implement a communication connection to another device.

The input module may include but is not limited to a touch panel, a keyboard, and the like. The output module may include a display screen and the like, and may be configured to implement human-computer interaction between the electronic device and the user.

The sensor may include one of or a combination of a plurality of an acceleration sensor, a pressure sensor, a magnetic sensor, a fingerprint sensor, an image sensor (a camera or the like), an ambient light sensor, or the like.

Technical terms used in embodiments of the present disclosure are merely used to describe specific embodiments but are not intended to limit the present disclosure. In this specification, singular forms "one", "this", and "the" are used to include plural forms at the same time, unless otherwise stated in the context. Further, "include" and/or "including" used in the specification mean/means the existence of features, the entirety, steps, operations, elements, and/or components, but do/does not rule out the existence or adding of one or more other features, entirety, steps, operations, elements, and/or components.

An equivalent form (if present) of a corresponding structure, material, action, and all apparatuses or steps and functional elements in the appended claims is intended to include any structure, material, or action used to perform the function in combination with other expressly required elements. Descriptions of the present disclosure are given for the purposes of embodiments and descriptions, but are not intended to be exhaustive or to be limited to a disclosed form by the present disclosure.

What is claimed is:

1. A fin field-effect transistor (FinFET), comprising:

a gate terminal;

a source terminal;

a drain terminal;

a resistor potential terminal;

valid gates coupled to the gate terminal;

fins arranged in parallel to each other, extending in a first direction, and comprising:

first fins disposed on a first side of the valid gates and coupled to the source terminal; and second fins disposed on a second side of the valid gates and coupled to the drain terminal; and a first dummy polycrystalline silicon layer located on the first side of the valid gates, wherein the valid gates and the first dummy polycrystalline silicon layer extend in a second direction and cover surfaces of the fins, wherein the first dummy polycrystalline silicon layer is coupled to and disposed between the gate terminal and the resistor potential terminal;

a second dummy polycrystalline silicon layer located on the first second side of the valid gates, a first dummy gate located between the first dummy polycrystalline silicon layer and the valid gates; and a second dummy gate located between the second dummy polycrystalline silicon layer and the valid gates, wherein the first dummy gate and the second dummy gate are suspended.

2. The FinFET of claim 1, wherein the first dummy polycrystalline silicon layer comprises a first end and a second end, wherein the first end is coupled to the gate terminal, and wherein the second end is coupled to the resistor potential terminal.

3. The FinFET of claim 1, wherein the second dummy polycrystalline silicon layer extends in the second direction and partially covers the surfaces of the fins, wherein a first end of the first dummy polycrystalline silicon layer is coupled to the gate terminal, wherein a second end of the first dummy polycrystalline silicon layer is coupled to a first end of the second dummy polycrystalline silicon layer, and wherein a second end of the second dummy polycrystalline silicon layer is coupled to the resistor potential terminal.

4. The FinFET of claim 3, wherein the first dummy gate and the second dummy gate extend in the second direction and partially cover the surfaces of the fins.

5. The FinFET of claim 4, wherein the first dummy polycrystalline silicon layer, the second dummy polycrystalline silicon layer, the first dummy gate, the second dummy gate, and the valid gates are of a same material.

6. The FinFET of claim 1, further comprising a third dummy polycrystalline silicon layer that extends in the second direction and partially covers the surfaces of the fins, wherein the third dummy polycrystalline silicon layer and the first dummy polycrystalline silicon layer are located on the first side of the valid gates, wherein a first end of the first dummy polycrystalline silicon layer is coupled to the gate terminal, wherein a second end of the first dummy polycrystalline silicon layer is coupled to a first end of the third dummy polycrystalline silicon layer, and wherein a second end of the third dummy polycrystalline silicon layer is coupled to the resistor potential terminal.

7. The FinFET of claim 1, further comprising a ground terminal, wherein the FinFET is an N-type FinFET, wherein the drain terminal is configured to couple to a signal cable, and wherein the resistor potential terminal and the source terminal are coupled to the ground terminal.

8. The FinFET of claim 1, further comprising a power terminal, wherein the FinFET is a P-type FinFET, wherein the drain terminal is configured to couple to a signal cable, and wherein the resistor potential terminal and the source terminal are connected to the power terminal.

9. The FinFET of claim 1, wherein the first direction is perpendicular to or nearly perpendicular to the second direction.

10. The FinFET of claim 1, wherein first pieces of the first dummy polycrystalline silicon layer are connected in series and used as a resistor.

11. The FinFET of claim 1, wherein the first dummy polycrystalline silicon layer forms a resistor to control uniform opening of the fins.

12. The FinFET of claim 1, wherein the first fins represent an active region of the FinFET and are a source of the FinFET.

13. The FinFET of claim 12, wherein the first fins are suspended.

14. The FinFET of claim 1, wherein the second fins represent an active region of the FinFET and are a drain of the FinFET.

15. The FinFET of claim 1, wherein the second fins are suspended.

16. The FinFET of claim 1, wherein the surfaces of the fins that are covered by the valid gates are channels of the FinFET.

17. The FinFET of claim 1, wherein the valid gates are coupled to the gate terminal.

18. The FinFET of claim 3, wherein the first dummy polycrystalline silicon layer, the second dummy polycrystalline silicon layer, the valid gates, the first dummy gate, and the second dummy gate have a same length in the first direction.

19. The FinFET of claim 3, wherein the first dummy polycrystalline silicon layer, the second dummy polycrystalline silicon layer, the valid gates, the first dummy gate, and the second dummy gate have a same width in the second direction.

20. The FinFET of claim 3, wherein the first dummy polycrystalline silicon layer, the second dummy polycrystalline silicon layer, the valid gates, the first dummy gate, and the second dummy gate are arranged at equal intervals.

* * * * *